(12) United States Patent
Lee et al.

(10) Patent No.: US 11,269,445 B2
(45) Date of Patent: Mar. 8, 2022

(54) TOUCH WINDOW FOR TOUCH SENSOR AND HOME APPLIANCE HAVING SAME

(71) Applicant: LG ELECTRONICS INC., Seoul (KR)

(72) Inventors: Moo Jin Lee, Seoul (KR); Dae Wook Kwak, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/934,835

(22) Filed: Jul. 21, 2020

(65) Prior Publication Data

US 2021/0048935 A1 Feb. 18, 2021

(30) Foreign Application Priority Data

Aug. 14, 2019 (KR) ........................ 10-2019-0099703

(51) Int. Cl.
*G06F 3/041* (2006.01)
*F25D 29/00* (2006.01)
(Continued)

(52) U.S. Cl.
CPC ....... *G06F 3/04164* (2019.05); *F25D 29/005* (2013.01); *G06F 1/1656* (2013.01);
(Continued)

(58) Field of Classification Search
CPC .... G06F 3/04164; G06F 3/044; G06F 1/1656; G06F 2203/04103; F25D 29/005; F25D 400/18; F25D 400/361
See application file for complete search history.

(56) References Cited

U.S. PATENT DOCUMENTS 10,054,361 B2 * 8/2018 Kim ..................... F25D 29/005
10,520,243 B2 * 12/2019 Kim ..................... F25D 23/028
(Continued)

FOREIGN PATENT DOCUMENTS

| EP | 2858247 | 4/2015 |
|---|---|---|
| KR | 100342736 | 7/2002 |
| KR | 100895147 | 5/2009 |

OTHER PUBLICATIONS

EP Extended European Search Report in European Appln. No. 20184614.4, dated Dec. 9, 2020, 8 pages.

*Primary Examiner* — Peter D McLoone
(74) *Attorney, Agent, or Firm* — Fish & Richardson P.C.

(57) ABSTRACT

A touch window for a touch sensor includes: a touch member having a front surface and a rear surface, the front surface configured to be pressed by a user, a plurality of conductive printed portions printed on the rear surface of the touch member, the conductive printed portions being configured to respectively contact a plurality of conductive electrodes of the touch sensor, and a non-conductive film attached to the rear surface of the touch member and defining one or more through-holes. Inner surfaces of the one or more through-holes are configured to respectively surround the conductive printed portions and the conductive printed portions and the non-conductive film have different thicknesses from each other such that surface condensation on the conductive printed portions and surface condensation on the non-conductive film are spaced apart from each other.

18 Claims, 10 Drawing Sheets

(51) Int. Cl.
    *G06F 1/16*    (2006.01)
    *G06F 3/044*   (2006.01)
(52) U.S. Cl.
    CPC .......... *G06F 3/044* (2013.01); *F25D 2400/18* (2013.01); *F25D 2400/361* (2013.01); *G06F 2203/04103* (2013.01)

(56) References Cited

U.S. PATENT DOCUMENTS

| | | | |
|---|---|---|---|
| 10,871,322 B2* | 12/2020 | Kim | G06F 3/0412 |
| 2006/0046038 A1* | 3/2006 | Nakanishi | G06F 3/04164 |
| | | | 428/212 |
| 2009/0107829 A1 | 4/2009 | Heimann | |
| 2017/0089633 A1* | 3/2017 | Kim | F25D 23/028 |
| 2019/0003761 A1* | 1/2019 | Kim | F25D 23/028 |
| 2019/0170434 A1* | 6/2019 | Kim | F25D 29/005 |
| 2020/0116420 A1* | 4/2020 | Kim | G06F 3/0412 |

* cited by examiner

TOUCH WINDOW FOR TOUCH SENSOR AND HOME APPLIANCE HAVING SAME

CROSS-REFERENCE TO RELATED APPLICATION

The present application claims benefit of priority to Korean Patent Application No. 10-2019-0099703, entitled "TOUCH WINDOW FOR TOUCH SENSOR AND HOME APPLIANCE HAVING SAME," filed on Aug. 14, 2019, in the Korean Intellectual Property Office, the entire disclosure of which is incorporated herein by reference.

BACKGROUND

Technical Field

The present disclosure relates to a touch window for a touch sensor and a home appliance including the touch window. More particularly, the present disclosure relates to a touch window for a touch sensor configured to sense a touch of a user, and a home appliance including the touch window.

Description of Related Art

A touch sensor is a sensor through which a user can input an instruction displayed on a screen by pressing the instruction with his or her fingertip.

In this regard, Korean Patent Registration No. 895147 (hereinafter, referred to as "related art 1") discloses a refrigerator. Related art 1 includes a door, a glass, a display, touch buttons, and a printed circuit board.

The touch buttons include a gasket and a metal member. The gasket senses static electricity generated when a finger touches the glass. The metal member is connected to the gasket, and transmits the generated electrostatic current to the printed circuit board. The metal member is mounted on the printed circuit board. The metal member may be formed in a rod shape. The metal member may be made of a copper material having high conductivity.

However, malfunction of the touch screen in related art 1 due to a surface condensation phenomenon easily occurs. When surface condensation occurs on a rear surface of the glass, adjacent gaskets become electrically connected to each other by the surface condensation. In such a state, when a user presses any one touch button, a plurality of the metal members simultaneously transmit electrostatic current to the printed circuit board. Accordingly, malfunction of the touch screen occurs.

Surface condensation is a phenomenon in which water vapor in moist air condenses into liquid water on the surface of an object when the surface temperature of the object falls to below the dew point of the air contacting the surface.

Surface condensation occurs easily in humid environments. In particular, surface condensation frequently occurs in areas with high temperature and humidity, such as Vietnam. It is not easy to prevent the occurrence of surface condensation. Accordingly, the applicant of the present disclosure has conducted research regarding a technique for avoiding malfunction of the touch screen even if surface condensation occurs on the touch screen in a high temperature and high humidity environment.

When the surface condensation is severe, water droplets forming on the rear surface of the glass may flow downward due to gravity. In order to prevent malfunction of the touch screen in such a situation, the gaskets should be individually isolated from each other. In order to isolate each gasket, however, it is necessary to design the rear surface of the glass in a complex shape. However, considering productivity-related factors, it is also necessary to avoid making design changes that complicate the design of simple components

RELATED ART DOCUMENTS

Patent Documents

Korean Patent Registration No. 895147 (registered on: Apr. 20, 2009)

SUMMARY OF THE DISCLOSURE

The present disclosure is directed to providing a touch window for a touch sensor that prevents malfunction of the touch window even when surface condensation occurs on a rear surface of the touch window in a high temperature and high humidity environment, and a home appliance including the touch window.

The present disclosure is further directed to providing a touch window for a touch sensor that, even when water droplets flow along the rear surface of the touch window, prevents malfunction of the touch window by blocking electrical connection from being made by the flowing water droplets, and a home appliance including the touch window.

The present disclosure is further directed to providing a touch window for a touch sensor that prevents malfunction of the touch window even when a large amount of condensation accumulates in a surface condensation isolation structure, and a home appliance including the touch window.

A touch window for a touch sensor according to an embodiment of the present disclosure is configured such that a plurality of conductive printed portions and a non-conductive film have different thicknesses from each other, such that surface condensation on the conductive printed portions and surface condensation on the non-conductive film are spaced apart from each other. Accordingly, a surface condensation isolation structure is formed such that even when surface condensation occurs on a rear surface of the touch window in a high temperature and high humidity environment, malfunction of the touch window can be prevented.

The touch window for a touch sensor may include a touch member, the conductive printed portions, and the non-conductive film.

A user may press a front surface of the touch member.

The conductive printed portions may be printed on a rear surface of the touch member. The conductive printed portions may be provided in plurality. The conductive printed portions may respectively contact a plurality of conductive electrodes of the touch sensor.

The non-conductive film may be attached to the rear surface of the touch member. One or more through-holes may be formed in the non-conductive film.

Inner surfaces of the one or more through-holes may respectively surround the conductive printed portions.

The inner surfaces of the one or more through-holes may protrude further from the rear surface of the touch member than the conductive printed portions. Accordingly, even when water droplets flow along the rear surface of the touch window, malfunction of the touch window can be prevented by blocking electrical connection from being made by the flowing water droplets.

The non-conductive film may include a first non-conductive film and a second non-conductive film.

The first non-conductive film may be attached to the rear surface of the touch member.

The second non-conductive film may be attached to a rear surface of the first non-conductive film.

The first non-conductive film may protrude further from the rear surface of the touch member than the conductive printed portions. Accordingly, surface condensation on the conductive printed portions and surface condensation on the second non-conductive film may be spaced apart from each other.

The through-holes may include a first through-hole and a second through-hole.

The first through-hole may be formed in the first non-conductive film.

The second through-hole may be formed in the second non-conductive film.

The first through-hole and the second through-hole may be connected to each other.

The inner surface of the second through-hole may be closer to the conductive electrode than the inner surface of the first through-hole.

The second non-conductive film may have a smaller thickness than the first non-conductive film. Accordingly, surface tension on the inner surface of the second through-hole may be reduced.

The touch member may include a touch panel, a printed portion, and a non-conductive sheet.

A user may press a front surface of the touch panel.

The printed portion may be printed on a rear surface of the touch panel.

The non-conductive sheet may be attached to the printed portion. The non-conductive sheet may block electrical conduction between the conductive printed portions caused by the printed portion.

The non-conductive sheet may include a first non-conductive sheet and a second non-conductive sheet.

The first non-conductive sheet may be attached to the printed portion.

The second non-conductive sheet may be attached to the first non-conductive sheet. The second non-conductive sheet may be penetrated at a portion thereof located between the conductive printed portion and the non-conductive film. Accordingly, even when a large amount of condensation accumulates in a surface condensation isolation structure, malfunction of the touch window can be prevented.

In addition, a touch window for a touch sensor according to another embodiment of the present disclosure is configured such that a non-conductive film protrudes further from a rear surface of a touch member than a first conductive printed portion, such that surface condensation on the first conductive printed portion and surface condensation on the non-conductive film are spaced apart from each other.

The touch window for a touch sensor according to this embodiment may include a touch member, the first conductive printed portion, a second conductive printed portion, and the non-conductive film.

A user may press a front surface of the touch member.

The first conductive printed portion may be printed on the rear surface of the touch member. The first conductive printed portion may contact a first conductive electrode of the touch sensor.

The second conductive printed portion may be printed on the rear surface of the touch member. The second conductive printed portion may contact a second conductive electrode of the touch sensor.

The non-conductive film may be attached to the rear surface of the touch member. The non-conductive film may form a structure that surrounds the first conductive printed portion.

In addition, a home appliance according to an embodiment of the present disclosure may be configured to include the touch window for a touch sensor.

The home appliance including the touch window for a touch sensor may be a washing machine.

According to embodiments of the present disclosure, by configuring the touch window for a touch sensor such that conductive printed portions and a non-conductive film have different thicknesses from each other such that surface condensation on the conductive printed portions and surface condensation on the non-conductive film are spaced apart from each other, a phenomenon in which adjacent conductive printed portions become electrically connected to each other by the surface condensation therebetween can be suppressed.

According to the embodiments of the present disclosure, since the non-conductive film protrudes further from a rear surface of a touch member than the conductive printed portions, a phenomenon in which water droplets forming on a rear surface of the non-conductive film become connected to the surface condensation on the conductive printed portions, and thereby adjacent conductive printed portions become connected to each other, can be suppressed.

According to the embodiments of the present disclosure, since a second non-conductive sheet attached to a rear surface of a first non-conductive sheet is penetrated at a portion thereof located between the conductive printed portion and the non-conductive film, the phenomenon in which adjacent conductive printed portions become electrically connected to each other can be suppressed even when a large amount of water condenses on the conductive printed portions.

BRIEF DESCRIPTION OF THE DRAWINGS

The foregoing and other aspects, features, and advantages of the disclosure, as well as the following detailed description of the embodiments, will be better understood when read in conjunction with the accompanying drawings. For the purpose of illustrating the present disclosure, there is shown in the drawings an exemplary embodiment, it being understood, however, that the present disclosure is not intended to be limited to the details shown because various modifications and structural changes may be made therein without departing from the spirit of the present disclosure and within the scope and range of equivalents of the claims. The use of the same reference numerals or symbols in different drawings indicates similar or identical items.

DETAILED DESCRIPTION

Figure 1:
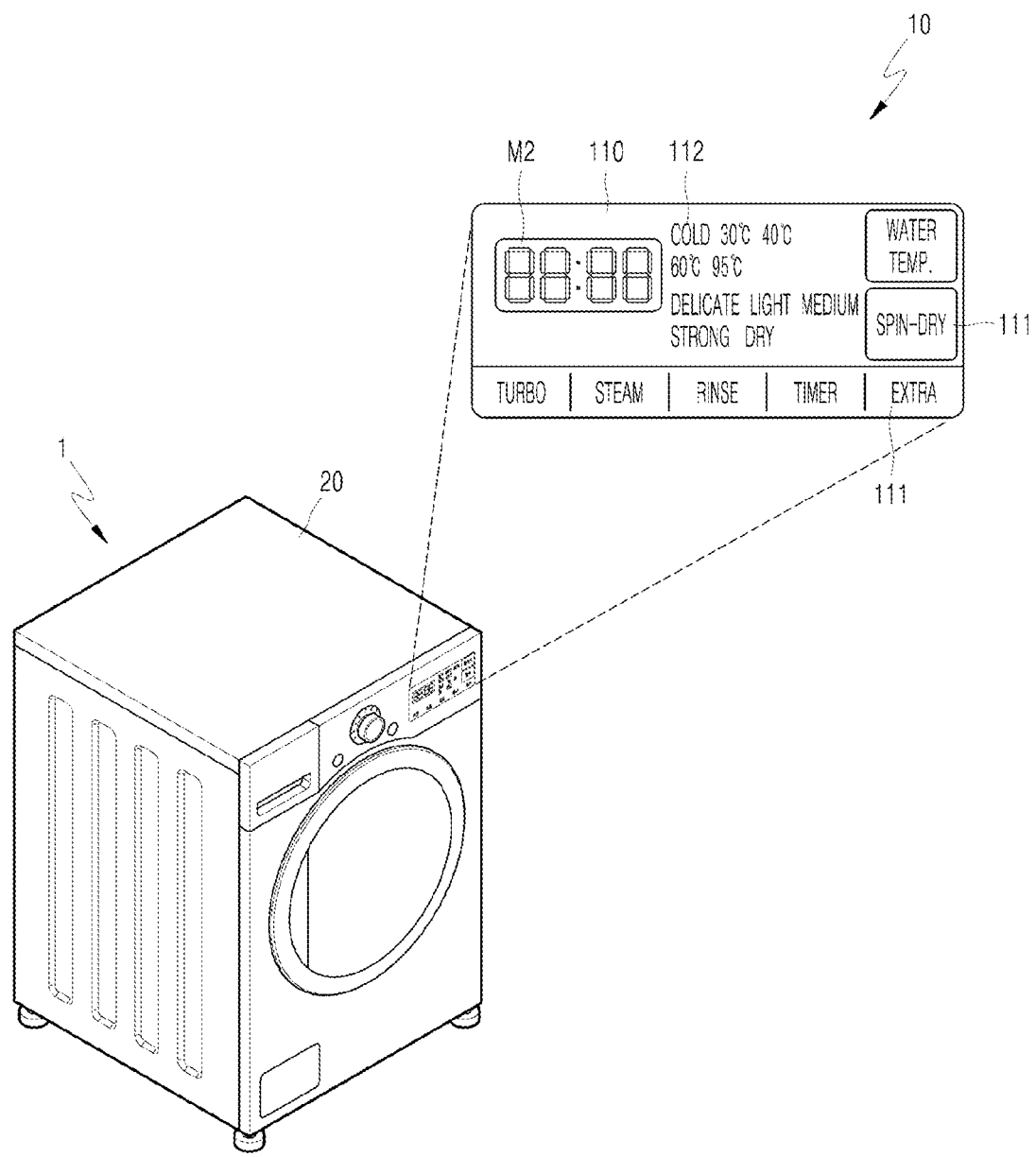
FIG. 1 is a front view of a home appliance according to an embodiment of the present disclosure.

Advantages and features of the present disclosure and methods for achieving them will become apparent from the descriptions of aspects herein below with reference to the accompanying drawings. However, the present disclosure is not limited to the aspects disclosed herein but may be implemented in various different forms. The aspects are provided to make the description of the present disclosure thorough and to fully convey the scope of the present disclosure to those skilled in the art. It is to be noted that the scope of the present disclosure is defined only by the claims.

The shapes, sizes, ratios, angles, the number of elements given in the drawings are merely exemplary, and thus, the present disclosure is not limited to the illustrated details. Like reference numerals designate like elements throughout the specification.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The term "or" as used herein is to be interpreted as an inclusive or meaning any one or any combination. Therefore, "A, B or C" means any of the following: "A; B; C; A and B; A and C; B and C; A, B and C". An exception to this definition will occur only when a combination of elements, functions, steps or acts are in some way inherently mutually exclusive.

Hereinafter, preferable exemplary embodiments of the present disclosure will be described in detail referring to the attached drawings. In the following description, known functions or features will be omitted in order to clarify the gist of the present disclosure.

Figure 2:
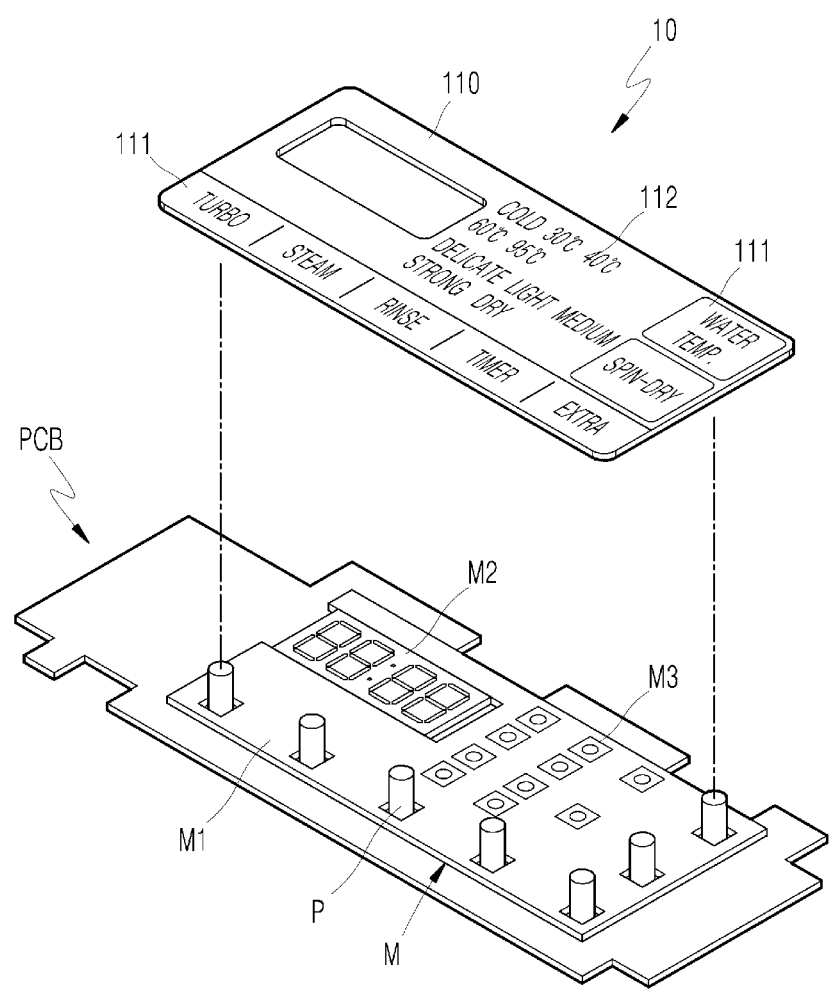
FIG. 2 is an exploded perspective view illustrating a touch window for a touch sensor and a printed circuit board according to an embodiment of the present disclosure.
Figure 3:
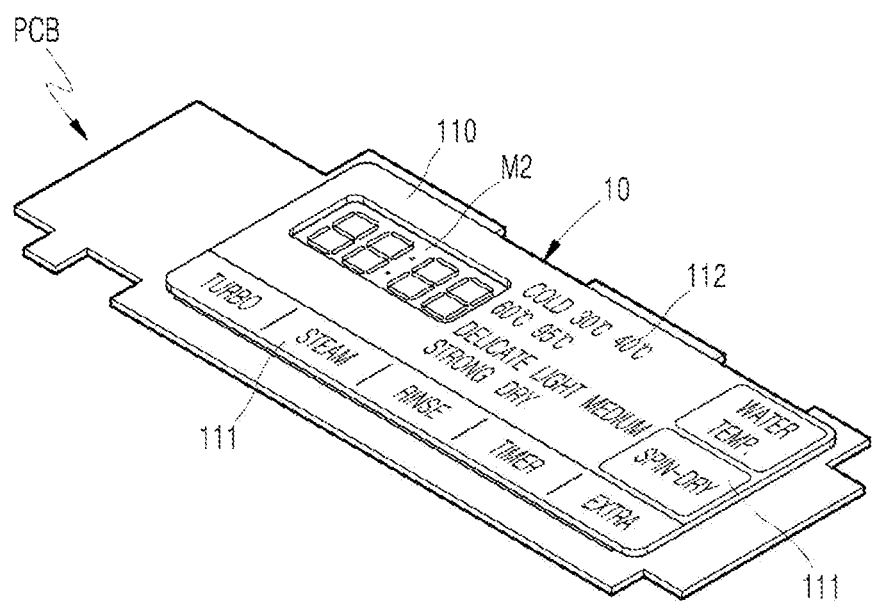
FIG. 3 is a perspective view of the touch window for a touch sensor and the printed circuit board of FIG. 2.

FIG. 1 is a front view of a home appliance 1 according to an embodiment of the present disclosure. FIG. 2 is an exploded perspective view illustrating a touch window 10 for a touch sensor and a printed circuit board PCB according to an embodiment of the present disclosure. FIG. 3 is a perspective view of the touch window 10 for a touch sensor and the printed circuit board PCB of FIG. 2.

As shown in FIGS. 1 to 3, the home appliance 1 according to an embodiment of the present disclosure is configured to operate in response to the touch sensor sensing a touch of a user on the touch window 10.

As shown in FIG. 1, the touch window 10 for a touch sensor according to an embodiment of the present disclosure is installed at one side of a case 20 of the home appliance 1. In FIG. 1, the home appliance 1 is illustrated as a drum washing machine. However, the home appliance 1 may also refer to a refrigerator, a microwave oven, a dryer, and an air conditioner.

As shown in FIG. 1, when the home appliance 1 is a drum washing machine, a plurality of touch-type buttons (hereinafter referred to as "touch buttons 111"), such as "turbo", "steam", "rinse", "timer", "extra", "water temperature", and "spin-dry" touch buttons 111, may be formed in the touch window 10.

The touch buttons 111 do not operate according to a mechanical structure. Rather, when a user presses the touch button 111, the touch sensor located behind the touch window 10 detects the touch of the user, and outputs a signal.

The touch sensor may be provided as a capacitive touch switch. The capacitive touch switch is soft to the touch, and can be designed to be thin. Accordingly, capacitive touch switches are used in various home appliances such as washing machines, refrigerators, air conditioners, and microwave ovens. The capacitive touch switch measures the capacitance generated between a finger and a conductive electrode, and then uses the measured capacitance to turn the switch on or off.

Techniques for determining that a human body is in contact with an input terminal by using a change in capacitance, such as the detection circuit using a change in capacitance disclosed in Korean Patent Registration No. 342736, are well-known, and as such, detailed description of the operation principles of the touch sensor will be omitted.

As shown in FIG. 2, the printed circuit board PCB is provided at the rear side of the touch window 10. Conductive electrodes P are mounted on the printed circuit board PCB. The conductive electrodes P are provided in a number equal to the number of the touch buttons 111. The conductive electrodes P are respectively provided at the rear side of the touch buttons 111. It is to be understood that the touch sensor is mounted on the printed circuit board PCB.

Although not illustrated in detail, the conductive electrodes P may be of a type that is stretchable by a compression spring, such as a pogo pin. As the rear surface of the touch window 10 approaches a display module M, the conductive electrodes P come into close contact with conductive printed portions by the compression force of the spring.

The display module M is coupled to the printed circuit board PCB. The display module M includes a body M1, a timer M2, and a plurality of LEDs M3.

The body M1 forms the skeleton of the display module M. The body M1 is coupled to the printed circuit board PCB. The body M1 is made of a synthetic resin. The timer M2 displays an indicator 112 of a washing time. The LEDs M3 are respectively disposed behind indicators 112, to be described below. When the user operates the touch window 10, the LED M3 may emit light to the indicators 112.

Although not illustrated, the touch window 10 for a touch sensor may be formed to engage with the case 20 of the home appliance 1. Alternatively, the touch window 10 for a touch sensor may be formed to be bolted to the case 20 of the home appliance 1.

Figure 4:
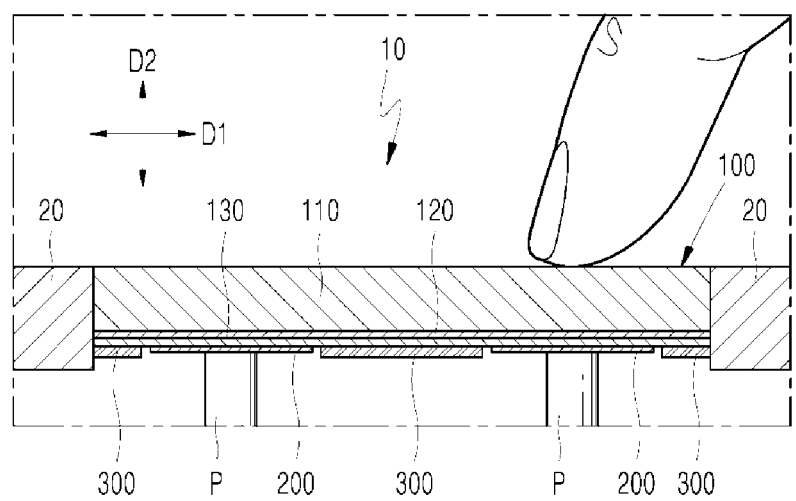
FIG. 4 is a partial sectional plan view illustrating a state in which the touch window for a touch sensor of FIG. 1 is in use.
Figure 5:
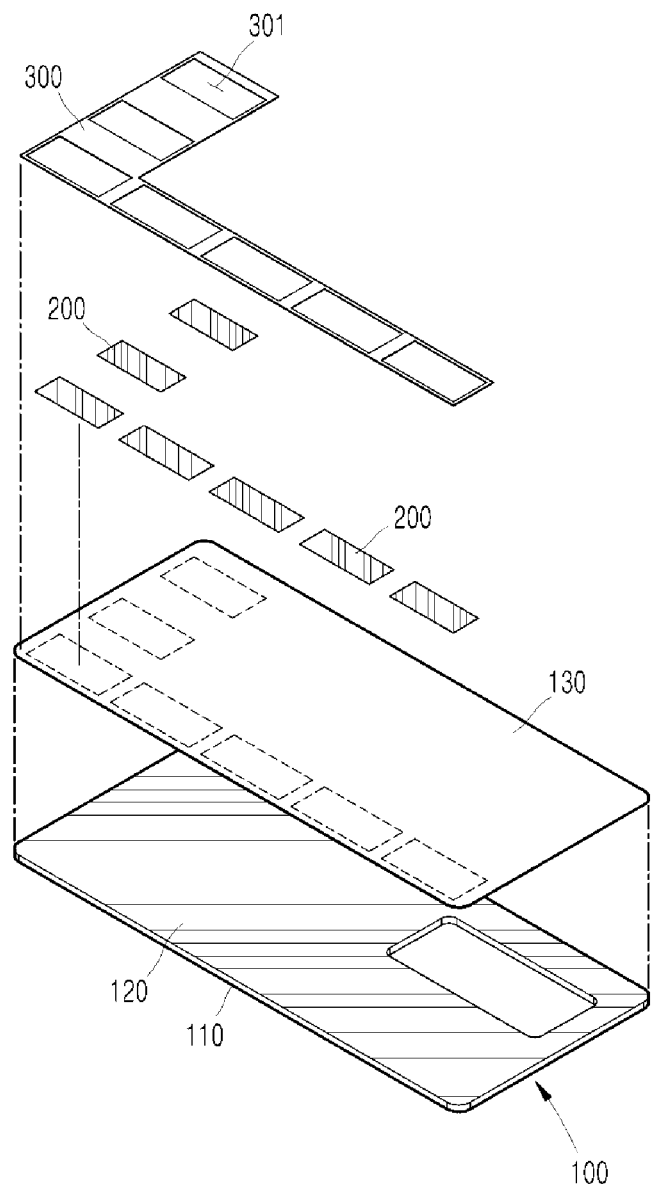
FIG. 5 is an exploded perspective view of a rear side of the touch window for a touch sensor of FIG. 2.
Figure 6:
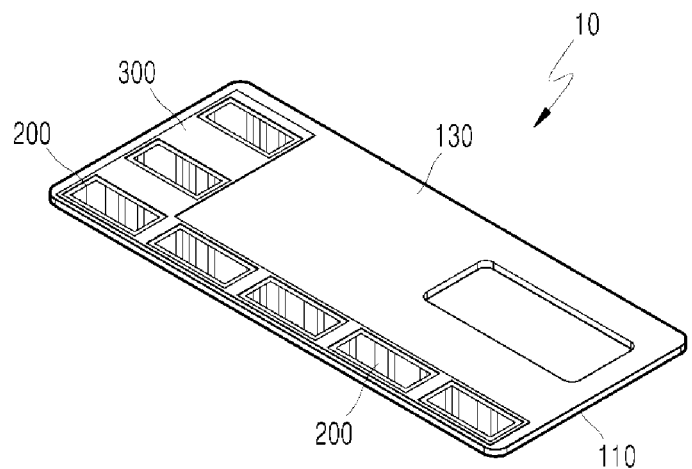
FIG. 6 is a perspective view of the rear side of the touch window for a touch sensor of FIG. 2.

FIG. 4 is a partial sectional plan view illustrating a state in which the touch window 10 for a touch sensor of FIG. 1 is in use. FIG. 5 is an exploded perspective view of the rear side of the touch window 10 for a touch sensor of FIG. 2. FIG. 6 is a perspective view of the rear side of the touch window 10 for a touch sensor of FIG. 2.

As illustrated in FIGS. 4 to 6, the touch window 10 for a touch sensor according to an embodiment of the present disclosure may include a touch member 100, conductive printed portions 200, and a non-conductive film 300.

As shown in FIG. 4, a user may press a front surface of the touch member 100. The touch member 100 may include a touch panel 110, a printed portion 120, and a non-conductive sheet 130.

As shown in FIGS. 4 and 5, the touch panel 110 forms the skeleton of the touch member 100. The touch panel 110 is made of a transparent synthetic resin. Excluding a region corresponding to an indicator 112 of time (hereinafter referred to as a "transparent region"), the front surface of the touch panel 110 may be painted (printed). That is, excluding the transparent region, the front surface of the touch panel 110 may be covered with a printed layer (coating layer).

As shown in FIG. 1, the touch buttons 111 are printed in the form of lines or characters on the front surface of the touch panel 110. When a user presses the touch button 111, the touch sensor located behind the touch window 10 detects the touch of the user, and outputs a signal.

In addition to the touch buttons 111, indicators 112, such as "cold", "30° C.", "40° C.", "60° C.", "95° C.", "delicate", "light", "medium", "strong", and "dry" may be formed on the front of the touch panel 110. The indicators 112 are also printed in the form of lines or characters on the front surface of the touch panel 110.

As shown in FIG. 5, the rear surface of the touch panel 110 may also be painted (printed), excluding the transparent region. The printed portion 120 refers to a printed layer (coating layer) on the rear surface of the touch panel 110. The printed portion 120 may be the same color as the background color of the front surface of the touch panel 110. The printed layers (coating layers) on the front and rear surfaces of the touch panel 110 define the color of the touch panel 110.

The printed portion 120 is made of a non-conductive ink. However, the non-conductive ink may also contain a trace amount of a conductive component. When such a conductive component is concentrated in one region of the printed portion 120, electrical conduction may occur in that area of the printed portion 120.

When the conductive printed portions 200 become electrically connected to each other by the printed portion 120, malfunction of the touch screen occurs. The non-conductive sheet 130 may be attached to the printed portion 120. The non-conductive sheet 130 blocks electrical conduction between the conductive printed portions 200 caused by the printed portion 120. The non-conductive sheet 130 may be made of a diffusion sheet that diffuses the light of the LEDs (M3).

As shown in FIGS. 5 and 6, the conductive printed portions 200 are printed on the rear surface of the touch member 100. The conductive printed portions 200 are printed (coated) with conductive ink. The conductive ink may include a carbon component. The conductive printed portions 200 are provided in a number equal to the number of the touch buttons 111. The conductive printed portions 200 are spaced apart from each other such that electricity does not pass therebetween.

As shown in FIG. 4, the touch sensor measures the capacitance generated between a finger and the conductive electrodes P. The conductive printed portions 200 respectively contact the conductive electrodes P of the touch sensor. The conductive printed portions 200 and the touch buttons 111 are approximately equal in area.

Accordingly, even when the user presses the edge of a touch button 111, the touch sensor (through the electrical conduction between the corresponding conductive printed portion 200 and conductive electrode P) can measure the capacitance generated between the finger and the conductive electrode P. As a result, the conductive printed portions 200 improve the sensitivity of the touch buttons 111.

As shown in FIGS. 5 and 6, the non-conductive film 300 is attached to the rear surface of the touch member 100. One or more through-holes 301 are formed in the non-conductive film 300. The number of through-holes 301 formed in the non-conductive film 300 may be equal to the number of the conductive printed portions 200.

As illustrated in FIGS. 4 and 6, when the non-conductive film 300 is attached to the rear surface of the touch member 100, inner surfaces of the through-holes 301 respectively form structures surrounding the conductive printed portions 200.

Hereinafter, for easy understanding of the present disclosure, the direction in which the conductive printed portions 200 are separated from each other will be referred to as a "plane direction D1". In addition, the thickness direction of the non-conductive film 300 will be referred to as the "thickness direction D2". The inner surfaces of the through-holes 301 and the conductive printed portions 200 may be slightly spaced apart from each other in the plane direction D1.

In Korean Patent Registration No. 895147, malfunction of the touch screen disclosed therein easily occurs due to a surface condensation phenomenon. When surface condensation occurs on a rear surface of a glass, adjacent gaskets are electrically connected to each other by the surface condensation.

In such a state, when a user presses any one touch button, a plurality of the metal members simultaneously transmit electrostatic current to the printed circuit board. Accordingly, malfunction of the touch screen occurs.

Surface condensation occurs easily in humid environments. In particular, surface condensation frequently occurs in areas with high temperature and humidity, such as Vietnam. It is not easy to prevent the occurrence of surface condensation.

Accordingly, the applicant of the present disclosure has conducted research regarding a technique for avoiding malfunction of the touch screen even if surface condensation occurs on the touch screen in a high temperature and high humidity environment.

Figure 7:
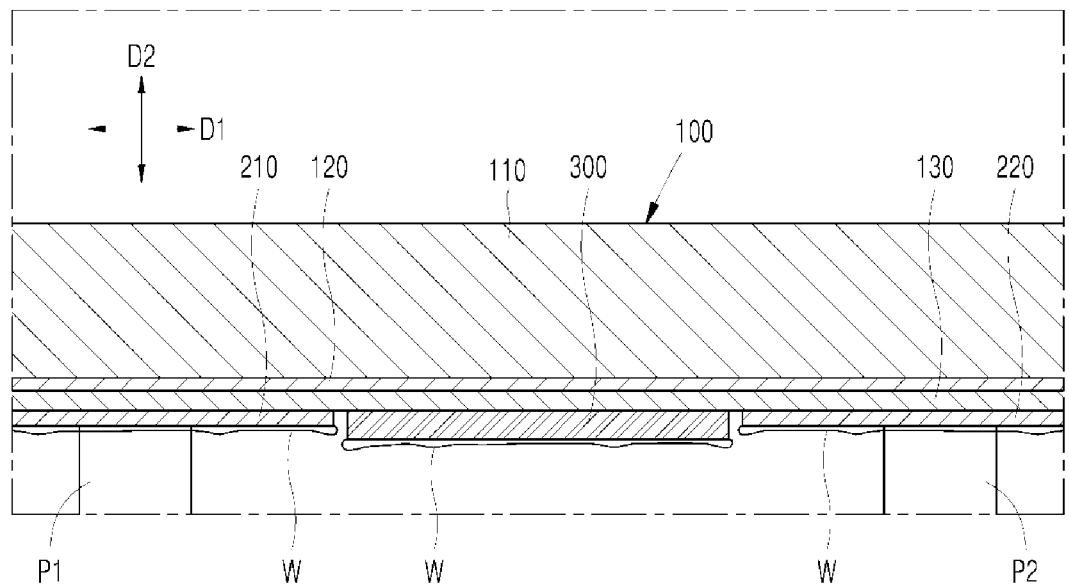
FIG. 7 is a partial sectional plan view of the touch window for a touch sensor of FIG. 1.

FIG. 7 is a partial sectional plan view of the touch window 10 for a touch sensor of FIG. 1.

For easy understanding of the present disclosure, the conductive electrode P on the left side in FIG. 7 is referred to as a first conductive electrode P1. In addition, the conductive electrode P on the right side in FIG. 7 is referred to as a second conductive electrode P2. In addition, the conductive printed portion 200 on the left side in FIG. 7 is referred to as a first conductive printed portion 210. In addition, the conductive printed portion 200 on the right side of FIG. 7 is referred to as a second conductive printed portion 220.

As shown in FIG. 7, the conductive printed portions 200 (that is, the first conductive printed portion 210 and the second conductive printed portion 220) are different in thickness from the non-conductive film 300. Accordingly, surface condensation W on the conductive printed portions 200 and the non-conductive film 300 are spaced apart from each other in the plane direction D1 and the thickness direction D2. Accordingly, even if the surface condensation W occurs on the rear surface of the touch window 10, the conductive printed portions 200 do not become electrically connected to each other by the surface condensation W.

The inner surface of the through-hole 301 protrudes further from the rear surface of the touch member 100 than the first conductive printed portion 210 and the second conductive printed portion 220. That is, the non-conductive film 300 protrudes further from the rear surface of the touch member 100 than the first conductive printed portion 210 and the second conductive printed portion 220.

That is, the non-conductive film 300 has a larger thickness than the first conductive printed portion 210 and the second conductive printed portion 220. Accordingly, the surface condensation W on the first conductive printed portion 210 and the second conductive printed portion 220 is closer to the non-conductive sheet 130 than the surface condensation W on the non-conductive film 300.

Figure 8:
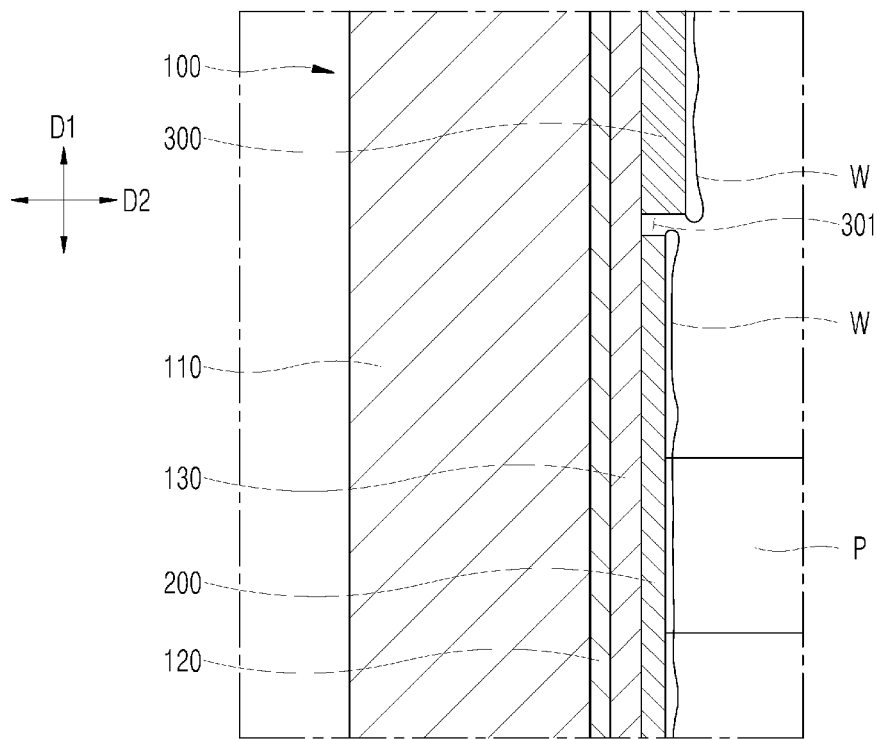
FIGS. 8 to 14 are partial sectional side views of the touch window for a touch sensor of FIG. 1.
Figure 9:
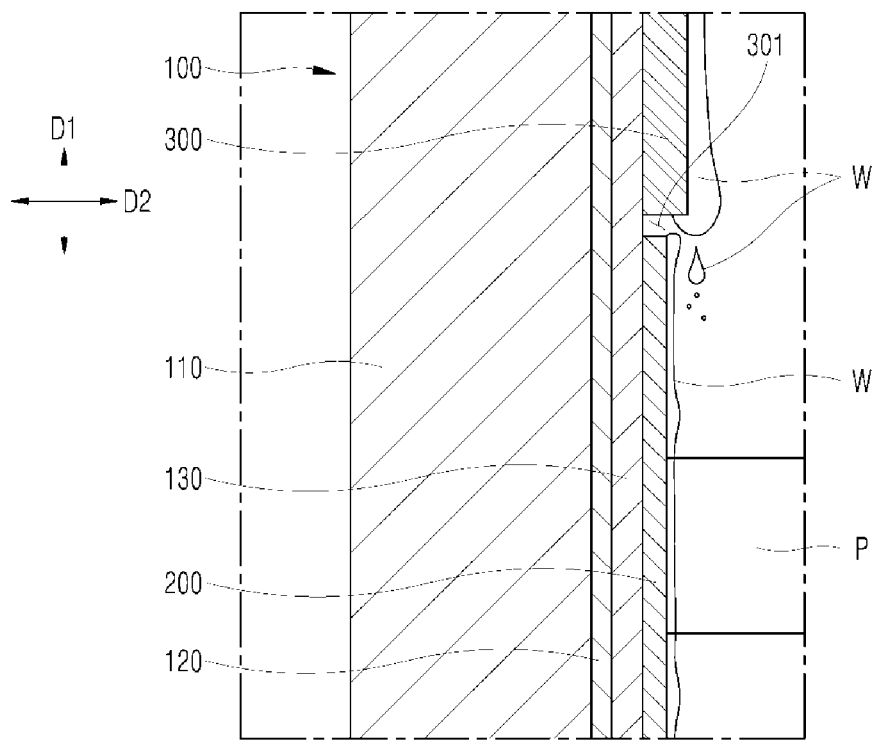

FIGS. 8 and 9 are partial sectional side views of the touch window 10 for a touch sensor of FIG. 1.

As shown in FIG. 8, when the inner surface of the through-hole 301 protrudes further from the rear surface of the touch member 100 than the conductive printed portion 200, the surface condensation W on the conductive printed portion 200 and the surface condensation W on the non-conductive film 300 are spaced apart from each other in the plane direction D1 and the thickness direction D2. However, if the surface condensation W phenomenon is severe, water droplets forming on the rear surface of the non-conductive film 300 may flow downward due to gravity.

As shown in FIG. 9, before the water droplets on the rear surface of the non-conductive film 300 fall down from the non-conductive film 300, surface tension of the water droplets is formed with the inner surface of the through-hole 301. In such a state, the surface condensation W on the non-conductive film 300 is close to the surface condensation W on the conductive printed portion 200.

Figure 10:
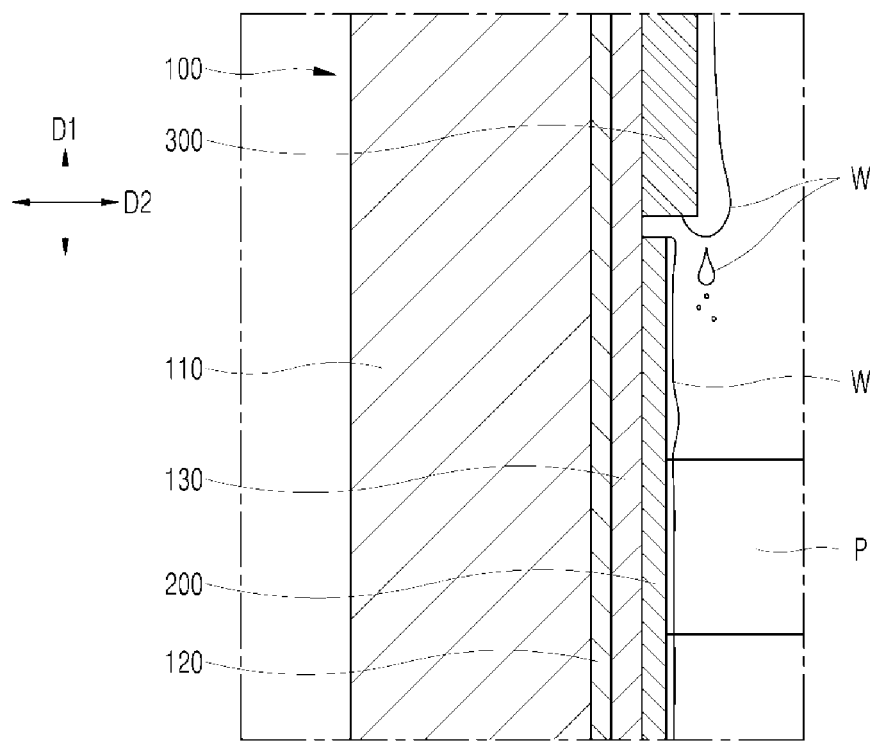

FIG. 10 is a partial sectional side view illustrating a thicker non-conductive film 300 than the non-conductive film 300 of FIG. 9.

As shown in FIGS. 9 and 10, in the touch window 10 for a touch sensor according to an embodiment of the present disclosure, by increasing the thickness of the non-conductive film 300, the surface condensation W on the non-conductive film 300 can be spaced apart in the thickness direction D2 from the surface condensation W on the conductive printed portion 200.

Figure 11:
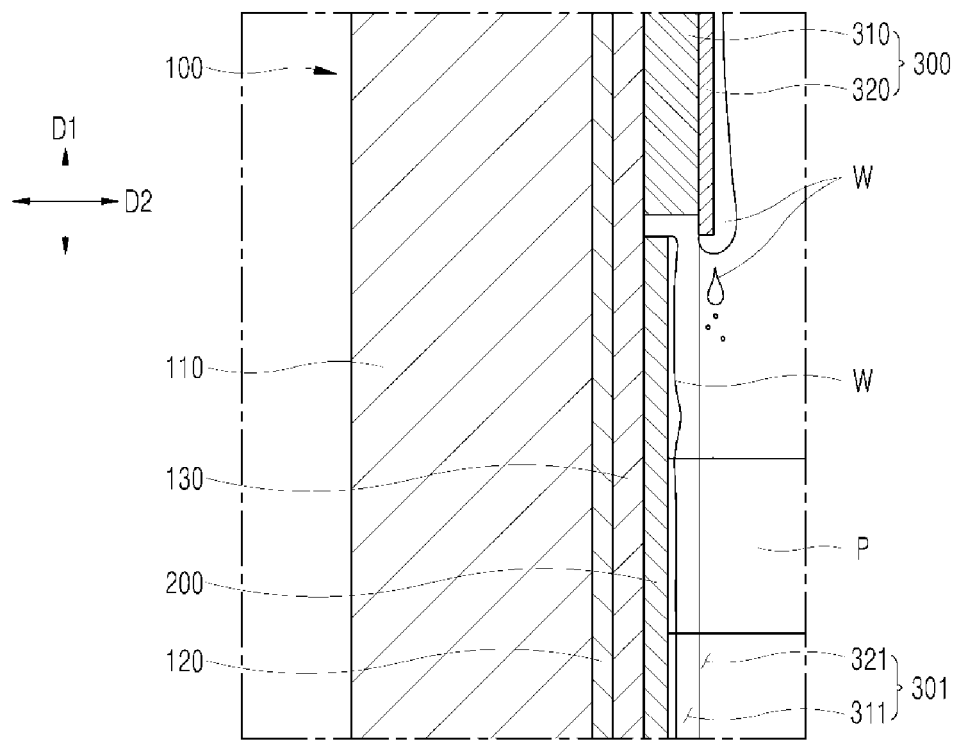

FIG. 11 is a partial sectional side view showing a touch window 10 for a touch sensor having a pair of non-conductive films 300.

As illustrated in FIG. 11, the non-conductive film 300 may include a first non-conductive film 310 and a second non-conductive film 320.

The first non-conductive film 310 is attached to the rear surface of the touch member 100. The second non-conductive film 320 is attached to the rear surface of the first non-conductive film 310. Accordingly, surface condensation W on the non-conductive film 300 can only occur on the rear surface of the second non-conductive film 320.

The first non-conductive film 310 protrudes further from the rear surface of the touch member 100 than the conductive printed portion 200. Accordingly, the surface condensation W on the conductive printed portion 200 and the surface condensation W on the second non-conductive film 320 are spaced apart from each other in the thickness direction D2.

The first non-conductive film 310 and the second non-conductive film 320 respectively have through-holes 301 formed therein. A through-hole in the first non-conductive film 310 (hereinafter referred to as a "first through-hole 311") and a through-hole in the second non-conductive film 320 (hereinafter referred to as a "second through-hole 321") are connected to each other.

As shown in FIG. 11, the inner surface of the second through-hole 321 may be closer to the conductive electrode P than the inner surface of the first-through-hole 311. That is, the second non-conductive film 320 may be closer to the conductive electrode P than the first non-conductive film 310.

Accordingly, before water droplets on the rear surface of the second non-conductive film 320 fall down from the second non-conductive film 320, surface tension of the water droplets is only formed with the inner surface of the second through-hole 321. That is, the water droplets on the rear surface of the second non-conductive film 320 do not form surface tension with the inner surface of the first through-hole 311 before falling down from the second non-conductive film 320.

The second non-conductive film 320 has a smaller thickness than the first non-conductive film 310. Accordingly, the area of the inner surface on which surface tension can be formed is smaller for the second through-hole 321 than for the first through-hole 311. Since the surface tension at the inner surface of the second through-hole 321 is relatively low, the water droplets on the rear surface of the second non-conductive film 320 easily fall down from the second non-conductive film 320.

Accordingly, even if water droplets forming on the rear surface of the second non-conductive film 320 flow downward and fall due to gravity, the conductive printed portions 200 do not easily become electrically connected to each other via the surface condensation W.

Figure 12:
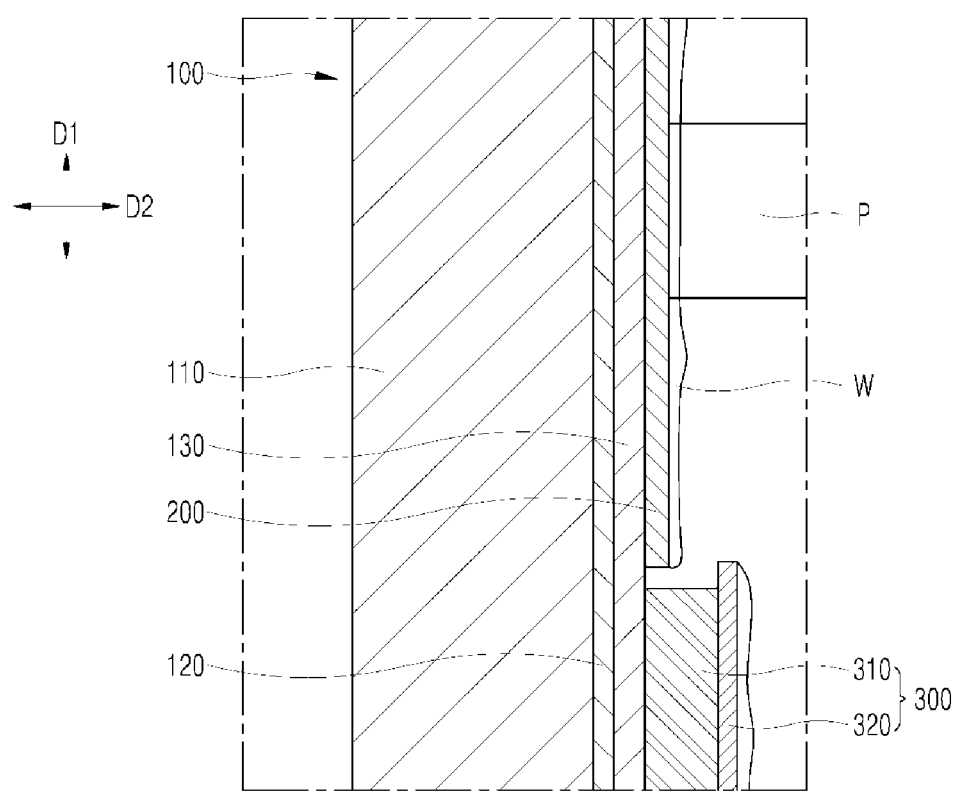
Figure 13:
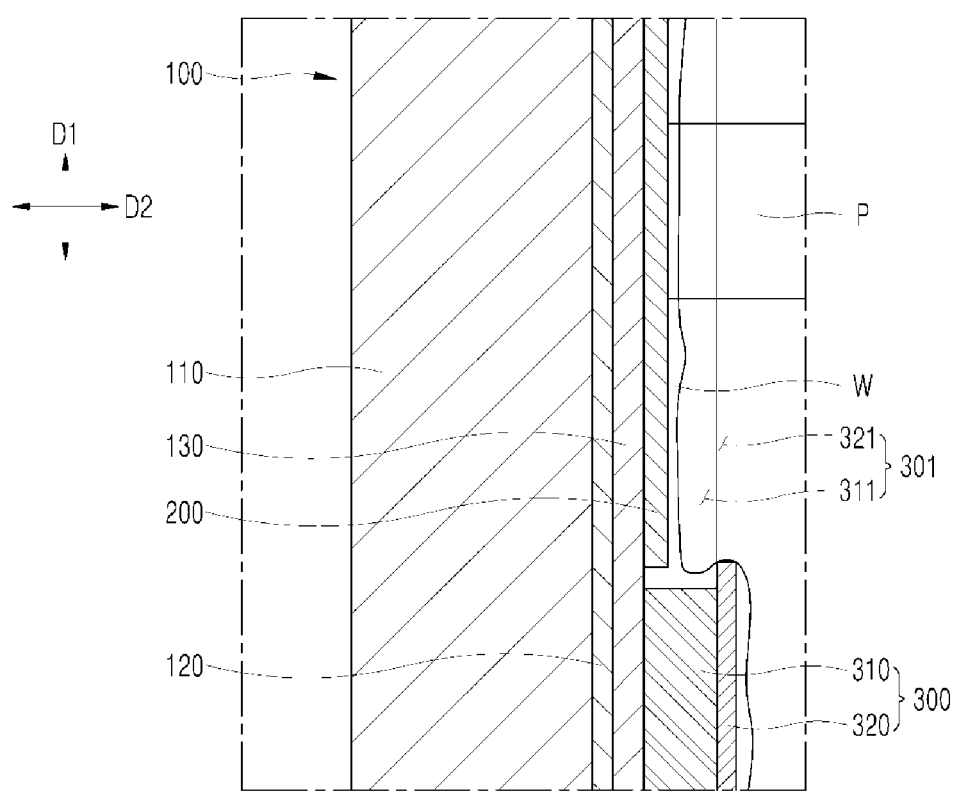

FIGS. 12 and 13 are partial sectional side views of the touch window 10 for a touch sensor of FIG. 1.

As shown in FIG. 12, when the inner surface of the through-hole 301 protrudes further from the rear surface of the touch member 100 than the conductive printed portion 200, the surface condensation W on the conductive printed portion 200 and the surface condensation W on the non-conductive film 300 are spaced apart from each other in the plane direction D1 and the thickness direction D2. However, if the surface condensation W phenomenon is severe, water droplets formed on the rear surface of the conductive printed portions 200 may flow downward due to gravity.

As shown in FIG. 13, the water droplets on the rear surface of the conductive printed portion 200 may flow downward from the conductive printed portion 200 and accumulate on the inner surface of the through-hole 311. Hereinafter, for easy understanding of the present disclosure, water that has flowed downward from the conductive printed portions 200 and accumulated on the inner surface of the first through-hole 311 will be referred to as "accumulated water".

The second non-conductive film 320 is closer to the conductive electrode P than the first non-conductive film 310. Accordingly, the accumulated water does not easily become connected to the surface condensation W on the rear surface of the second non-conductive film 320. However, when the surface condensation W phenomenon is severe and the amount of the accumulated water increases, the accumulated water may become connected to the surface condensation W on the rear surface of the second non-conductive film 320.

Figure 14:
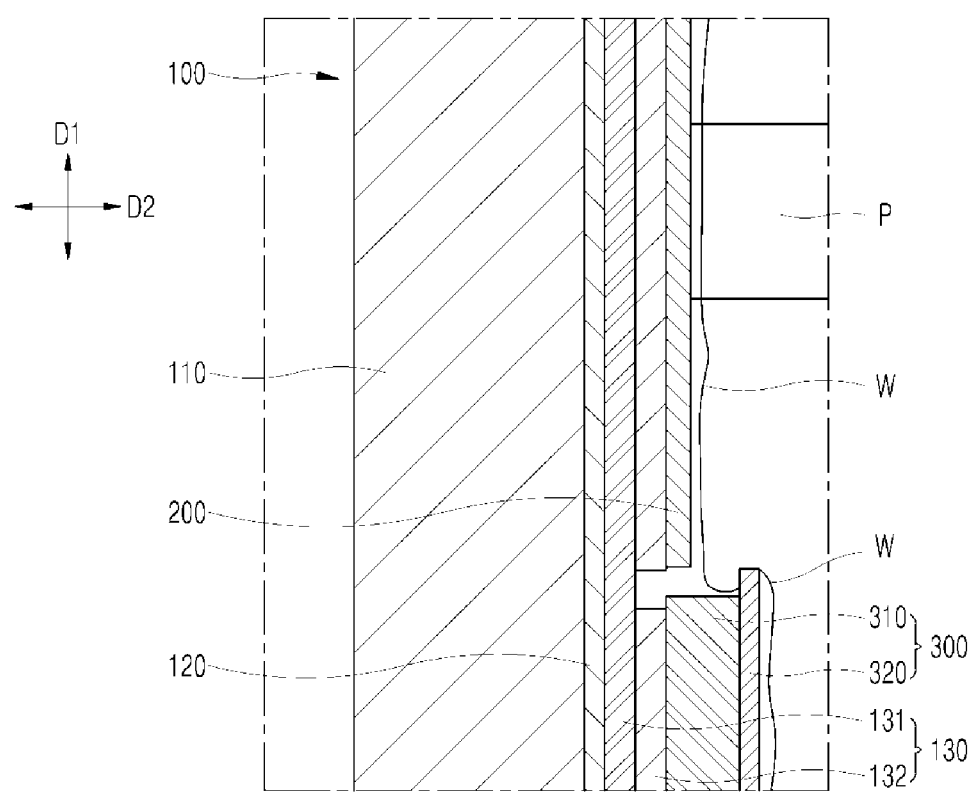

FIG. 14 is a partial sectional side view illustrating a second non-conductive sheet 132 that is penetrated at a portion thereof by a hole that is formed so as to be in communication with a space between the conductive printed portion 200 and the non-conductive film 300.

As illustrated in FIG. 14, the non-conductive sheet 130 may include a first non-conductive sheet 131 and a second non-conductive sheet 132.

The first non-conductive sheet 131 is attached to the printed portion 120. The first non-conductive sheet 131 blocks electrical conduction between the conductive printed portions 200 caused by the printed portion 120. The second non-conductive sheet 132 is attached to the rear surface of the first non-conductive sheet 131. The second non-conductive sheet 132 is penetrated at a portion thereof by a hole that is formed so as to be in communication with the space between the conductive printed portion 200 and the non-conductive film 300. Hereinafter, for easy understanding of the present disclosure, the portion of the second non-conductive sheet 132 that is penetrated by the hole will be referred to as a "penetrated region".

As shown in FIG. 14, the penetrated region forms a space in which water flowing downward from the conductive printed portion 200 can accumulate between the conductive printed portion 200 and the non-conductive film 300. Accordingly, even when the surface condensation W phenomenon is severe and the amount of the accumulated water increases, connection of the accumulated water with the surface condensation W on the rear surface of the second non-conductive film 320 can be delayed.

While the foregoing has been given by way of illustrative example of the present disclosure, all such and other modifications and variations thereto as would be apparent to those skilled in the art are deemed to fall within the broad scope and ambit of this disclosure as is herein set forth. Accordingly, such modifications or variations are not to be regarded as a departure from the spirit or scope of the present disclosure, and it is intended that the present disclosure cover the modifications and variations of this disclosure provided they come within the scope of the appended claims and their equivalents.

DESCRIPTION OF SYMBOLS

1: home appliance
10: touch window
100: touch member
110: touch panel
111: touch buttons
112: indicators
120: printed portion
130: non-conductive sheet
131: first non-conductive sheet
132: second non-conductive sheet
300: non-conductive film
301: through-hole
310: first non-conductive film
311: first through-hole
320: second non-conductive film
321: second through-hole
20: case
200: conductive printed portion
210: first conductive printed portion
220: second conductive printed portion
PCB: printed circuit board
P: conductive electrode
P1: first conductive electrode
P2: second conductive electrode
M: display module
M1: body
M2: timer
M3: LEDs
W: surface condensation
D1: plane direction
D2: thickness direction

What is claimed is:

1. A touch window for a touch sensor, comprising:
a touch member having a front surface and a rear surface, the front surface configured to be pressed by a user;
a plurality of conductive printed portions printed on the rear surface of the touch member, the conductive printed portions being configured to respectively contact a plurality of conductive electrodes of the touch sensor; and
a non-conductive film attached to the rear surface of the touch member and defining one or more through-holes,
wherein inner surfaces of the one or more through-holes are configured to respectively surround the conductive printed portions,
wherein the conductive printed portions and the non-conductive film have different thicknesses from each other such that surface condensation on the conductive printed portions and surface condensation on the non-conductive film are spaced apart from each other, and
wherein the touch member comprises:
a touch panel having a front surface and a rear surface, the front surface configured to be pressed by a user,
a printed portion printed on the rear surface of the touch panel, and a non-conductive sheet attached to the printed portion, the non-conductive sheet being configured to block electrical conduction between the plurality of conductive printed portions caused by the printed portion.

2. The touch window for a touch sensor of claim 1, wherein the inner surfaces of the one or more through-holes protrude further from the rear surface of the touch member compared to how much the conductive printed portions protrude from the rear surface of the touch member.

3. The touch window for a touch sensor of claim 1, wherein the non-conductive sheet comprises:
a first non-conductive sheet attached to the printed portion; and
a second non-conductive sheet attached to a rear surface of the first non-conductive sheet,
wherein a hole is defined in a portion of the second non-conductive sheet to be in communication with a space between the conductive printed portions and the non-conductive film.

4. The touch window for a touch sensor of claim 1, wherein the non-conductive sheet is made of a diffusion sheet.

5. The touch window for a touch sensor of claim 1, wherein the printed portion is made of a non-conductive ink.

6. The touch window for a touch sensor of claim 1, wherein the non-conductive film comprises:
a first non-conductive film attached to the rear surface of the touch member; and
a second non-conductive film attached to a rear surface of the first non-conductive film.

7. The touch window for a touch sensor of claim 6, wherein the first non-conductive film protrudes further from the rear surface of the touch member compared to how much the conductive printed portions protrude from the rear surface of the touch member, such that surface condensation on the conductive printed portions and surface condensation on the second non-conductive film are spaced apart from each other.

8. The touch window for a touch sensor of claim 6, wherein the one or more through-holes comprise:
a first through-hole defined in the first non-conductive film; and
a second through-hole defined in the second non-conductive film,
wherein the first through-hole and the second through-hole are connected to each other.

9. The touch window for a touch sensor of claim 8, wherein an inner surface of the second through-hole is closer to the conductive electrodes than an inner surface of the first through-hole.

10. The touch window for a touch sensor of claim 9, wherein the second non-conductive film is thinner than the first non-conductive film, such that surface tension at the inner surface of the second through-hole is reduced.

11. The touch window for a touch sensor of claim 1, wherein the conductive printed portions are printed with a conductive ink.

12. The touch window for a touch sensor of claim 11, wherein the conductive ink includes a carbon component.

13. The touch window for a touch sensor of claim 1, further comprising a plurality of touch buttons, wherein a number of the plurality of touch buttons equals a number of the plurality of conductive printed portions.

14. The touch window for a touch sensor of claim 1, wherein the conductive printed portions are spaced apart from each other such that electricity does not pass therebetween.

15. A home appliance comprising a touch window for a touch sensor of claim 1.

16. A touch window for a touch sensor, comprising:
a touch member having a front surface and a rear surface, the front surface configured to be pressed by a user;
a first conductive printed portion printed on the rear surface of the touch member, the first conductive printed portion being configured to contact a first conductive electrode of the touch sensor;
a second conductive printed portion printed on the rear surface of the touch member, the second conductive printed portion being configured to contact a second conductive electrode of the touch sensor; and
a non-conductive film attached to the rear surface of the touch member, the non-conductive film being configured to surround the first conductive printed portion,
wherein the non-conductive film protrudes further from the rear surface of the touch member compared to how much the first conductive printed portion protrudes from the rear surface of the touch member such that surface condensation on the first conductive printed portion and surface condensation on the non-conductive film are spaced apart from each other, and
wherein the touch member comprises:
a touch panel having a front surface and a rear surface, the front surface configured to be pressed by a user,
a printed portion printed on the rear surface of the touch panel, and
a non-conductive sheet attached to the printed portion, the non-conductive sheet being configured to block electrical conduction between the first conductive printed portion and the second conductive printed portion caused by the printed portion.

17. The touch window for a touch sensor of claim 16, wherein the non-conductive film comprises:
a first non-conductive film attached to the rear surface of the touch member; and
a second non-conductive film attached to a rear surface of the first non-conductive film.

18. The touch window for a touch sensor of claim 16, wherein the first conductive printed portion and the second conductive printed portion are printed with a conductive ink.

* * * * *